US009793056B1

(12) United States Patent
Bag et al.

(10) Patent No.: US 9,793,056 B1
(45) Date of Patent: Oct. 17, 2017

(54) METHOD FOR PRODUCING HIGH QUALITY, ULTRA-THIN ORGANIC-INORGANIC HYBRID PEROVSKITE

(71) Applicants: Santanu Bag, Beavercreek, OH (US); Michael F Durstock, West Chester, OH (US)

(72) Inventors: Santanu Bag, Beavercreek, OH (US); Michael F Durstock, West Chester, OH (US)

(73) Assignee: The United States of America as represented by the Secretary of the Air Force, Washington, DC (US)

( * ) Notice: Subject to any disclaimer, the term of this patent is extended or adjusted under 35 U.S.C. 154(b) by 0 days.

(21) Appl. No.: 15/233,171

(22) Filed: Aug. 10, 2016

(51) Int. Cl.
*H01G 9/00* (2006.01)
*H01L 51/42* (2006.01)
(Continued)

(52) U.S. Cl.
CPC ......... *H01G 9/0029* (2013.01); *H01G 9/2013* (2013.01); *H01L 31/072* (2013.01);
(Continued)

(58) Field of Classification Search
CPC .. H01G 9/0029; H01G 9/2013; H01L 31/072; H01L 51/0028; H01L 51/42; H01L 51/4213; H01L 51/0077; H01L 2031/0344
See application file for complete search history.

(56) References Cited

U.S. PATENT DOCUMENTS

| 5,871,579 A * | 2/1999 | Liang ........................ C23C 2/04 117/54 |
| 6,180,956 B1 | 1/2001 | Mitzi et al. |
| 2015/0367616 A1 | 12/2015 | McGehee et al. |

FOREIGN PATENT DOCUMENTS

| WO | WO2013171520 | 11/2013 |
| WO | WO2014180780 | 11/2014 |

(Continued)

OTHER PUBLICATIONS

M. A. Green, A. H. Baillie and H. J. Snaith, "The emergence of perovskite solar cells", Nat. Photonics, 2014, 8, 506-514.

(Continued)

*Primary Examiner* — Kyoung Lee
(74) *Attorney, Agent, or Firm* — AFMCLO/JAZ; Timothy M. Barlow

(57) ABSTRACT

A method for making a layered perovskite structure comprises: a) performing a vapor assisted surface treatment (VAST) of a substrate with a surface passivating agent; b) applying a layer of $PbI_2$ to the passivating agent; c) exposing the $PbI_2$ to methylammonium iodide ($CH_3NH_3I$) in an orthogonal solvent; and d) annealing the structure. A PEDOT:PSS coated ITO glass substrate may be used. The surface passivation agent may be one a chalcogenide-containing species with the general chemical formula $(E_3E_4)N(E_1E_2)N'C=X$ where any one of $E_1$, $E_2$, $E_3$ and $E_4$ is independently selected from C1-C15 organic substituents comprising from 0 to 15 heteroatoms or hydrogen, and X is S, Se or Te, thiourea, thioacetamide, selenoacetamide, selenourea, $H_2S$, $H_2Se$, $H_2Te$ or LXH wherein L is a $C_n$ organic substituent comprising heteroatoms and X=S, Se, or Te. The passivating agent may be applied by spin-coating, inkjet-printing, slot-die-coating, aerosol-jet printing, PVD, CVD, and electrochemical deposition.

9 Claims, 6 Drawing Sheets

(51) Int. Cl.
  *H01L 51/00* (2006.01)
  *H01L 31/072* (2012.01)
  *H01G 9/20* (2006.01)
  *H01L 31/0256* (2006.01)

(52) U.S. Cl.
  CPC .......... *H01L 51/0028* (2013.01); *H01L 51/42* (2013.01); *H01L 51/4213* (2013.01); *H01L 51/0077* (2013.01); *H01L 2031/0344* (2013.01)

(56) References Cited

FOREIGN PATENT DOCUMENTS

| WO | WO2014202965 | 12/2014 |
|---|---|---|
| WO | WO2015127494 | 9/2015 |
| WO | WO2015177521 | 11/2015 |

OTHER PUBLICATIONS

Y. Li et al., "High-efficiency robust perovskite solar cells on ultrathin flexible substrates", Nat. Comm., 2016, DOI:10.1038/ncomms10214.

M. Park et al., Mechanically recoverable and highly efficient perovskite solar cells: investigation of intrinsic flexibility of organic—inorganic perovskite, Adv. Energy Mater., 2015, DOI: 10.1002/aenm.201501406.

M. Kaltenbrunner et al., "Flexible high power-per-weight perovskite solar cells with chromium oxide—metal contacts for improved stability in air", Nat. Mater., 2015, DOI: 10.1038/NMAT4388.

T. Salim, S. Sun, Y. Abe, A. Krishna, A. C. Grimsdale and Y. M. Lam, "Perovskite-based solar cells: impact of morphology and device architecture on device performance", J. Mater. Chem. A., 2015, 3, 8943-8969.

K.-G. Lim, H.-B. Kim, J. Jeong, H. Kim, J. Y. Kim, T.-W. Lee, "Boosting the power conversion efficiency of perovskite solar cells using self-organized polymeric hole extraction layers with high work function", Adv. Mater. 2014, 26, 6461-6466.

J. H. Heo et al., "Stable semi-transparent CH3NH3PbI3 planar sandwich solar cells", Energy Environ. Sci., 2015, 8, 2922-2927.

J. W. Jung, C.-C. Chueh, A. K.-Y. Jen, "High-performance semi-transparent perovskite solar cells with 10% power conversion efficiency and 25% average visible transmittance based on transparent CuSCN as the hole-transporting material", Adv. Energy Mater., 2015, DOI: 10.1002/aenm.201500486.

A. Cannavale, G. E. Eperon, P. Cossari, A. Abate, H. J. Snaith, G. Gigli, "Perovskite photovoltachromic cells for building integration", Energy Environ. Sci., 2015, 8, 1578-1584.

* cited by examiner

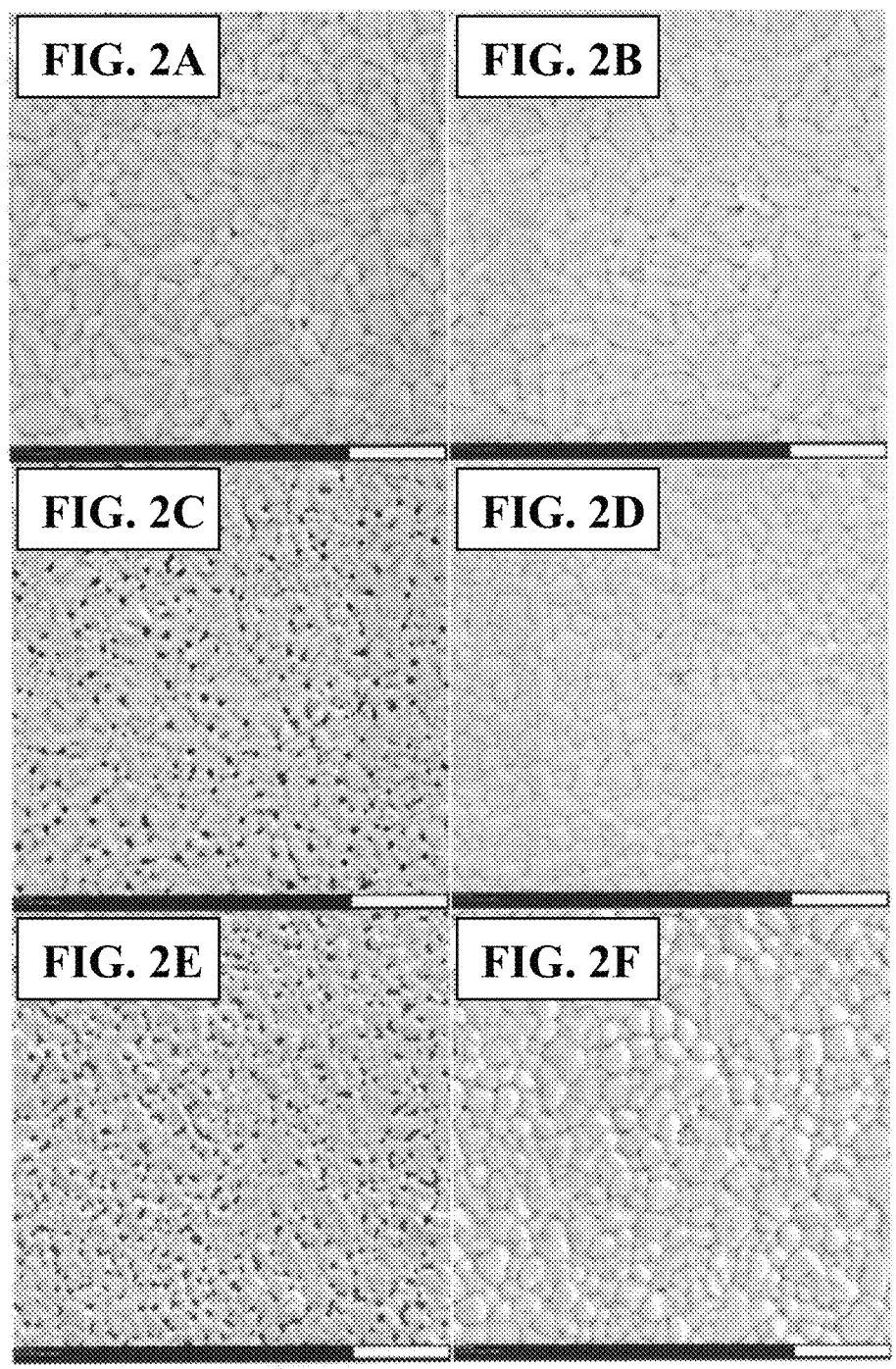

US 9,793,056 B1

METHOD FOR PRODUCING HIGH QUALITY, ULTRA-THIN ORGANIC-INORGANIC HYBRID PEROVSKITE

RIGHTS OF THE GOVERNMENT

The invention described herein may be manufactured and used by or for the Government of the United States for all governmental purposes without the payment of any royalty.

FIELD OF THE INVENTION

The present invention relates generally to hybrid organic-inorganic lead perovskites and, more particularly, to a method to produce high quality, ultra-thin organic-inorganic hybrid perovskite.

BACKGROUND OF THE INVENTION

A semitransparent photovoltaic (PV) device, in a variety of form factors, can address a range of applications outside the scope of traditional PV modules. Examples include building-integrated photovoltaics, photovoltaic curtains, self-powered green-houses, and wearable electronics. Solution-processable organic and dye-sensitized solar cells (OPV and DSSC, respectively) were studied for this purpose over the past several years due to their potential for low-cost, roll-to-roll compatible manufacturing process, light weight, mechanical flexibility, and color tunability with different material set. However, the overall performance of these solar cells, in terms of their average visible transparency (AVT) and power conversion efficiency (PCE), needs further improvement to meet requirements for practical applications. Because the fabrication of semitransparent solar cells requires a trade-off between the PCE and transparency of devices, such high-performance devices are very demanding benchmarks in the field of solution processed photovoltaics.

In order to improve the figure of merit of solution processed semitransparent PV devices, the use of high efficiency, thin-film hybrid perovskite absorber materials is quite appealing. Recently, methylammonium lead trihalide ($CH_3NH_3PbX_3$; X=Cl, Br, I) perovskites have rapidly emerged as a class of materials that may impact future PV technologies. The unique characteristics of these materials include excellent semiconducting properties, intense light absorption (absorption coefficient over $10^4$ $cm^{-1}$), tunable band gaps (1.2 to 2.3 eV), good crystallinity, low exciton binding energy, superior ambipolar carrier transport properties (charge carrier diffusion length over 1000 nm and lifetime over 100 ns), low temperature solution processibility and >15% PCEs (Certified 22.1%). Despite its relatively new entry in the PV field, only since 2009, its meteoric rise in PCE has made it an excellent contender in the field of thin-film photovoltaics. Efficient semitransparent solar cells would add further traits to the intriguing attributes of hybrid perovskites.

To fabricate high efficiency perovskite solar cells, typically, at least three different functional layers, an electron transport metal-oxide layer (e.g. $TiO_2$), an intrinsic absorber (i.e. perovskite), and an organic hole-transport layer (HTL) (frequently spiro-OMeTAD) are stacked on top of each other, and the device is completed by forming proper electrode contacts (i.e. FTO or ITO on one side, Ag or Al on other side) on each side. However, the use of thick (≈200 nm) organic hole-transport layer leads to parasitic absorption losses, and thereby, reduces the overall transparency of the device stack. Also, the fabrication of this type of device layout involves high temperature (>400° C.) sintering step for metal-oxides, which limits the technology's true benefit of all low-temperature solution processability, and preclude its applicability to flexible plastic based devices. Thus, perovskite device structures, devoid of metal-oxide interlayers, and comprised of the thinnest possible interlayers without significantly compromising the charge extraction, are highly desirable for low temperature, semitransparent solar cell fabrication.

SUMMARY OF THE INVENTION

The present invention overcomes the foregoing problems and other shortcomings, drawbacks, and challenges of manufacturing pinhole-free, continuous, thin, semitransparent perovskite films. While the invention will be described in connection with certain embodiments, it will be understood that the invention is not limited to these embodiments. To the contrary, this invention includes all alternatives, modifications, and equivalents as may be included within the spirit and scope of the present invention.

According to one embodiment of the present invention, a method for making a layered perovskite structure, comprises
a) performing a vapor assisted surface treatment (VAST) of a substrate with a surface passivating agent;
b) applying a layer of $PbI_2$ to the passivating agent;
c) exposing the $PbI_2$ to methylammonium iodide ($CH_3NH_3I$) in an orthogonal solvent; and
d) annealing the structure.

This method results in a pinhole-free, continuous, thin, semitransparent perovskite film which is further integrated into high efficiency devices.

According to variation, the substrate is a PEDOT:PSS coated ITO glass substrate.

According to another variation, the surface passivation agent is at least one a chalcogenide-containing species with the general chemical formula $(E_3E_4)N(E_1E_2)N'C=X$ where any one of $E_1$, $E_2$, $E_3$ and $E_4$ is independently selected from C1-C15 organic substituents comprising from 0 to 15 heteroatoms or hydrogen, and X is S, Se or Te, thiourea, thioacetamide, selenoacetamide, selenourea, $H_2S$, $H_2Se$, $H_2Te$ or LXH wherein L is a $C_n$ organic substituent comprising heteroatoms and X=S, Se, or Te.

According to a further variation, the passivating agent is applied by a process selected from spin-coating, inkjet-printing, slot-die-coating, aerosol-jet printing, physical and chemical vapor deposition, and electrochemical deposition.

According to another variation, the orthogonal solvent is isopropanol.

According to a further variation, the annealing step is performed at 130° C. or lower. The annealing may be performed by either thermal or photonic processes, with or without solvent.

According to another variation, the annealing step is performed at 80° C. or lower.

According to a further variation, the annealing step is performed with a DMF vapor or DMSO vapor.

According to another variation, the steps of applying a layer of $PbI_2$ to the passivating agent, and exposing the $PbI_2$ to methylammonium iodide ($CH_3NH_3I$) in the orthogonal solvent are performed as a single step with the $PbI_2$ and methylammonium iodide ($CH_3NH_3I$) mixed in a common solvent.

Additional objects, advantages, and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated in and constitute a part of this specification, illustrate embodiments of the present invention and, together with a general description of the invention given above, and the detailed description of the embodiments given below, serve to explain the principles of the present invention.

FIGS. 2A-2F depict top-down SEM images of $CH_3NH_3PbI_3$ perovskite films with thicknesses of 310 nm (FIGS. 2A, 2B), 180 nm (FIGS. 2C, 2D), and 110 nm (FIGS. 2E, 2F) on untreated (FIGS. 2A, 2C, 2E) and thiourea treated (FIGS. 2B, 2D, 2F) glass/ITO/PEDOT:PSS surface. The scale bars in the SEM micrographs are 2 μm.

FIG. 6B, $V_{oc}$; FIG. 6C, $J_{sc}$; and FIG. 6D, FF) with varied perovskite layer thicknesses, prepared without (marked with a ring) and with (marked with a box) surface passivation strategy. Solid lines represent normal devices with top Al (150 nm) electrode, whereas dotted lines are for fully semitransparent devices with Ag (10 nm) top electrode.

Figure 1A:
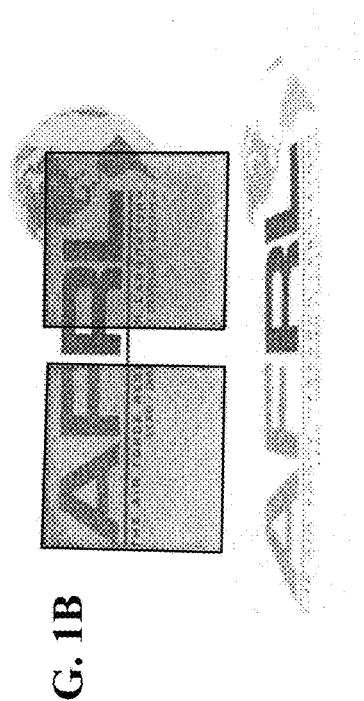
FIG. 1A depicts an illustration of the VAST process.

It should be understood that the appended drawings are not necessarily to scale, presenting a somewhat simplified representation of various features illustrative of the basic principles of the invention. The specific design features of the sequence of operations as disclosed herein, including, for example, specific dimensions, orientations, locations, and shapes of various illustrated components, will be determined in part by the particular intended application and use environment. Certain features of the illustrated embodiments have been enlarged or distorted relative to others to facilitate visualization and clear understanding. In particular, thin features may be thickened, for example, for clarity or illustration.

DETAILED DESCRIPTION OF THE INVENTION

Recently, a planar heterojunction (PHJ) device structure using poly(3,4-ethylenedioxythiophene):poly(4-styrenesulfonate) (PEDOT:PSS) as an HTL material and phenyl-C61-butyric acid methyl ester (PCBM) as an electron transport layer (ETL) shows promise due to its process compatibility with flexible substrates and low parasitic absorption, and PCEs >15% have been demonstrated with an optimized 300 nm perovskite active layer. Thus, by simply reducing the thickness of the solid perovskite absorber layer while maintaining the similar levels of efficiency would be an effective strategy to fabricate high performance semitransparent solar cells. However, the high quality perovskite film growth on PEDOT:PSS surface using solution based processing is quite challenging, especially for thinner (<200 nm) perovskite layer, as it creates lots of pinholes and incomplete surface coverage, resulting in low resistance shunt pathways and therefore, poor device performance. Here, we demonstrate a new surface passivation strategy to fabricate pinhole-free, continuous, semitransparent, thin perovskite films on PEDOT:PSS surface and thereby, increase their PV PCEs. A simple passivation method based on thiourea vapor treatment (called vapor assisted surface treatment, VAST) on a very thin (≈40 nm) PEDOT:PSS layer in a glass/ITO/PEDOT:PSS/$CH_3NH_3PbI_3$/PCBM/$C_{60}$/Al device structure enabled as high as 11.5% and 10.3% PCEs using thin perovskite films of 150 nm and 110 nm, respectively. The corresponding fully semitransparent devices showed PCEs of 9.4% and 8.2% with respective AVT of 29% and 34% in the 400-800 nm spectral range, when the opaque top Al (150 nm) electrode was replaced with an evaporated 10 nm thin transparent Ag electrode. These findings highlight the importance of surface modification for achieving high quality semitransparent perovskite films for PV or other relevant system integrated device applications.

The following examples illustrate particular properties and advantages of some of the embodiments of the present invention. Furthermore, these are examples of reduction to practice of the present invention and confirmation that the principles described in the present invention are therefore valid but should not be construed as in any way limiting the scope of the invention.

Despite some successes of applying low temperature, solution processed PEDOT:PSS as a HTL in p-i-n type PHJ perovskite device structures, a major challenge lies in how to control fully solution based perovskite deposition conditions to minimize pinhole formations. A variety of deposition techniques (e.g. one-step, two-step or multistep sequential coating), film growth environments, and ink formulations were developed by several research groups to address this issue. Irrespective of the variation of those different parameters, we found that surface properties of PEDOT:PSS hole transport layer considerably affect the perovskite film morphology. This becomes more pronounced when semitransparent films with thickness less than 200 nm are fabricated. Therefore, a facile and general approach that can effectively passivate the PEDOT:PSS surface properties is highly desirable for continuous, high quality, semitransparent perovskite film formation.

Figure 1B:
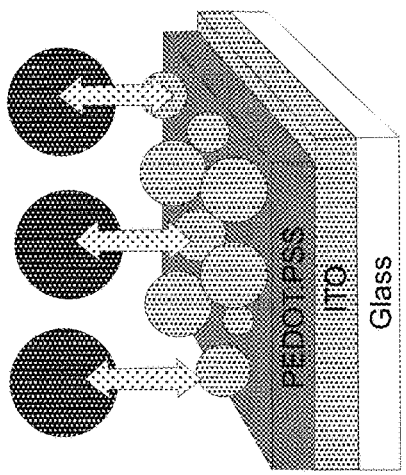
FIG. 1B depicts photographs of 110 nm thick $CH_3NH_3PbI_3$ on glass/ITO/PEDOT:PSS substrate (left: without thiourea treatment, right: with thiourea treatment) show similar optical transparency.
Figure 1C:
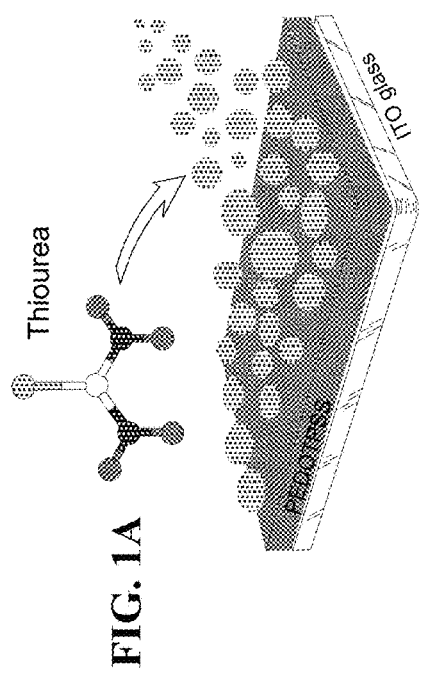
FIGS. 1C-1D depict a schematic representation showing PEDOT:PSS surface passivation by thiourea.
Figure 1D:
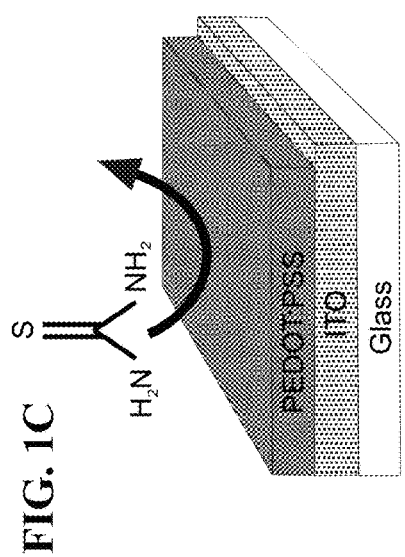

FIG. 1A depicts an illustration of the VAST process. FIG. 1B depicts photographs of 110 nm thick $CH_3NH_3PbI_3$ on a glass/ITO/PEDOT:PSS substrate (left: without thiourea treatment, right: with thiourea treatment) showing similar optical transparency. FIGS. 1C-1D depict schematic representations showing PEDOT:PSS surface passivation by thiourea. The chalcogenide rich species are believed to enhance the surface-$PbI_2$ contact by a soft-soft type interaction.

The surface passivation of a very thin PEDOT:PSS layer (40 nm), referred to as VAST, is developed by treating the glass/ITO/PEDOT:PSS surface in thiourea vapor (see FIG. 1A) for different lengths of time (up to 90 min). The use of thiourea vapor during the VAST process generates chalcogenide rich species, and smooths and passivates the PEDOT:PSS surface. To fabricate $CH_3NH_3PbI_3$ perovskite film on top of the passivated surface, a $PbI_2$ dimethyl-formamide (DMF) solution was first spin-coated at high spinning rate to minimize the coarsening of crystals and then subsequently annealed at moderate temperature (80° C.) to remove coordinated solvent and crystallize $PbI_2$. The resulting $PbI_2$ film was subsequently exposed to $CH_3NH_3I$, dissolved in an orthogonal solvent (isopropanol, IPA) during a rapid spin coating process, and was gradually transformed to $CH_3NH_3PbI_3$ perovskite by interdiffusion of precursors. Solvent annealing of the stacked films at 100° C. with DMF vapor drives their complete conversion to perovskite phase and helps to achieve better quality polycrystals. A progressive decrease in perovskite film thickness was achieved by gradual reduction of the starting precursor concentration. Typically, a combination of 40 wt % of $PbI_2$/DMF and 4.5 wt % of $CH_3NH_3$/IPA solution yield ~310 nm of perovskite on glass/ITO/PEDOT:PSS surface under the conditions studied. For control samples, all fabrication steps were done exactly the same way, side-by-side, under the same processing environment except the use of VAST on PEDOT:PSS. There was no observable change in the optical transparency of the perovskite films by the VAST process (FIG. 1B), while the perovskite surface coverage improved significantly, as discussed in the following section. The inorganic component of hybrid $CH_3NH_3PbI_3$ perovskite comprises lead (Pb) and iodine (I), which are considered as highly polarizable species. We propose that by passivating the PEDOT:PSS surface with soft, polarizable chalcogenide species, the surface favorable interaction (soft-soft type) between the perovskite precursors (i.e. $PbI_2$) and PEDOT:PSS surface is enhanced (FIG. 1C), leading to improved perovskite film coverage.

The quality of the thin perovskite films with different thicknesses, fabricated via VAST was assessed by scanning electron microscopy (SEM) and compared with the control samples. FIGS. 2A-2F depict top-down SEM images of $CH_3NH_3PbI_3$ perovskite films with thicknesses of 310 nm (FIGS. 2A, 2B), 180 nm (FIGS. 2C, 2D), and 110 nm (FIGS. 2E, 2F) on untreated (FIGS. 2A, 2C, 2E) and thiourea treated (FIGS. 2B, 2D, 2F) glass/ITO/PEDOT:PSS surface. The scale bars in the SEM micrographs are 2 μm. As shown in FIGS. 2A, 2B, there is no remarkable difference in the film morphology between the VAST based and control samples when the thickness of the perovskite film is >300 nm. In both cases, the perovskite films possess the characteristics of full surface coverage on the PEDOT:PSS coated glass/ITO substrates. On the other hand, distinct improvements in film coverage of the VAST based films against non-treated films are observed as thinner perovskites (<200 nm) are formed (FIGS. 2D, 2F vs. FIGS. 2C and 2E). In general, these thin perovskite films; formed without applying the VAST, contain numerous pinholes which lead to incomplete surface coverage. But the fabrication of these perovskite films of similar thicknesses (<200 nm) via VAST significantly reduces the pinhole formation and improves the overall quality of the films, leading to almost 100% surface coverage. These unprecedented characteristics of the thin perovskite growth on the surface treated PEDOT:PSS could be due to the combination of the relative smoothness of the preformed PEDOT:PSS layer along with the surface favorable interaction as we hypothesized earlier.

Figure 3:
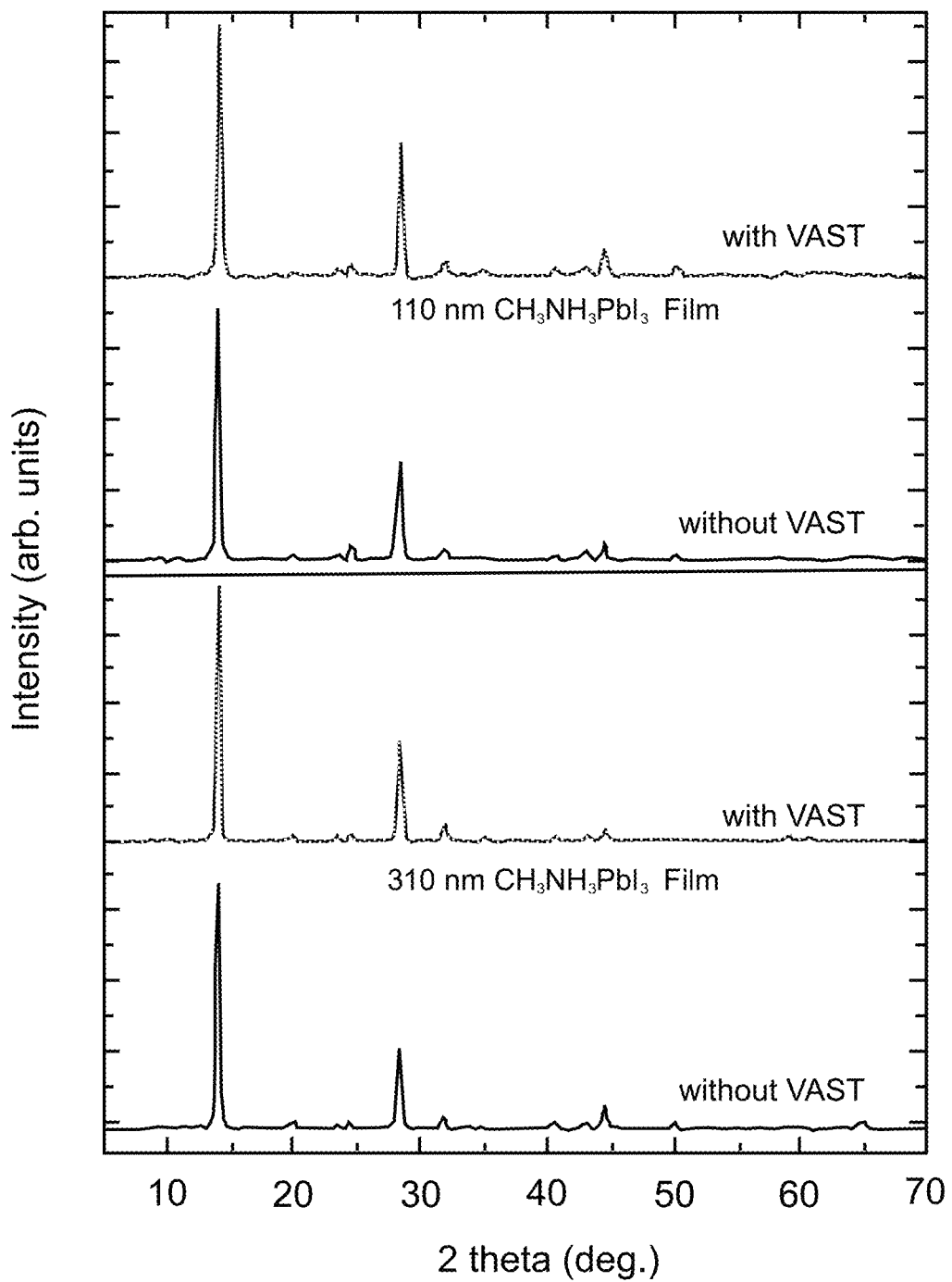
FIG. 3 depicts X-ray diffraction patterns of a 110 nm and a 310 nm perovskite $CH_3NH_3PbI_3$ film grown on glass/ITO/PEDOT:PSS surface with and without the VAST process.

The powder X-ray diffraction (PXRD) patterns (see FIG. 3) of those resulting $CH_3NH_3PbI_3$ films show several well defined peaks indicating very high degree of crystallinity, and closely match with a tetragonal perovskite phase. The absence of any $PbI_2$ and $CH_3NH_3I$ impurity peak in those fabricated perovskite films suggests complete conversion of $PbI_2$ to $CH_3NH_3PbI_3$ independent of surface treatments.

Figure 4:
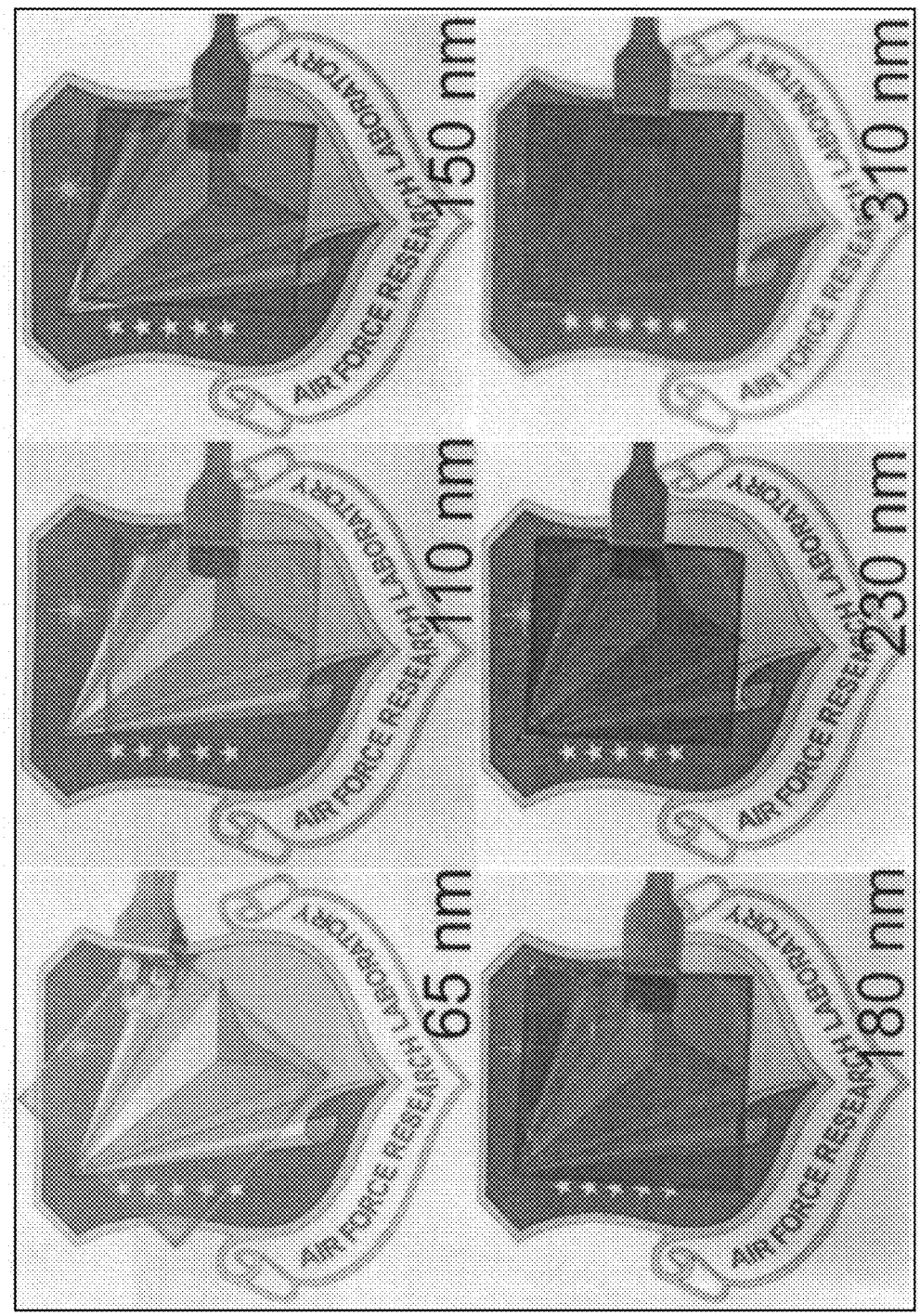
FIG. 4 depicts photographs of $CH_3NH_3PbI_3$ perovskite films with varied thickness on thiourea treated glass/ITO/PEDOT:PSS surface. Some of the films are highly transparent.

FIG. 4 shows photographs of the perovskite films with thickness ranging from 310 nm to 65 nm on the VAST based glass/ITO/PEDOT:PSS surface. FIG. 4 depicts photographs of $CH_3NH_3PbI_3$ perovskite films with varied thickness on a thiourea-treated glass/ITO/PEDOT:PSS surface. Some of the films are highly transparent. The transparency of those layer-stacks increases with decrease in the perovskite layer thickness, showing gradual change in film color from dark brown to more neutral color. Because the VAST process allowed production of high quality, solution processed perovskite layer as thin as 110 nm on glass/ITO/PEDOT:PSS surfaces without any major surface coverage issue, we integrated these thin perovskite films into fully semitransparent devices with a transparent top electrode.

Figure 5A:
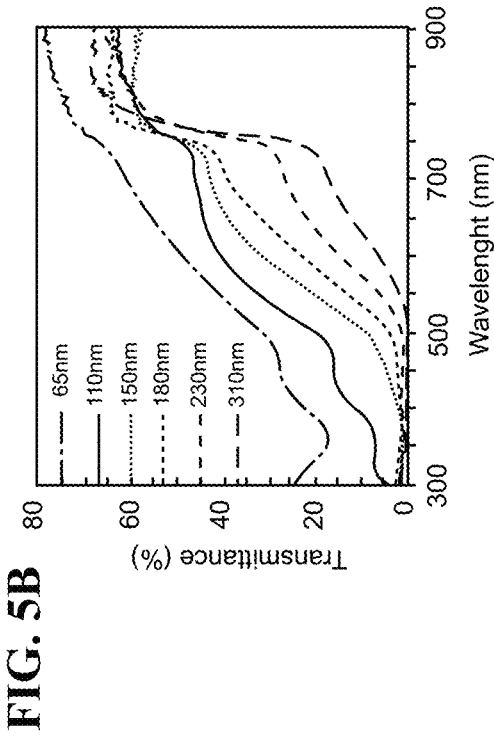
FIG. 5A depicts a semitransparent perovskite solar cell device structure.
Figure 5B:
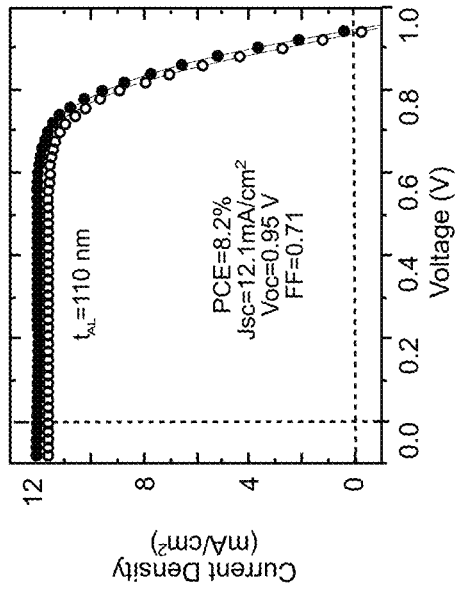
FIG. 5B depicts UV-Vis transmittance spectra through the complete semitransparent device for different perovskite layer thicknesses.
Figure 5C:
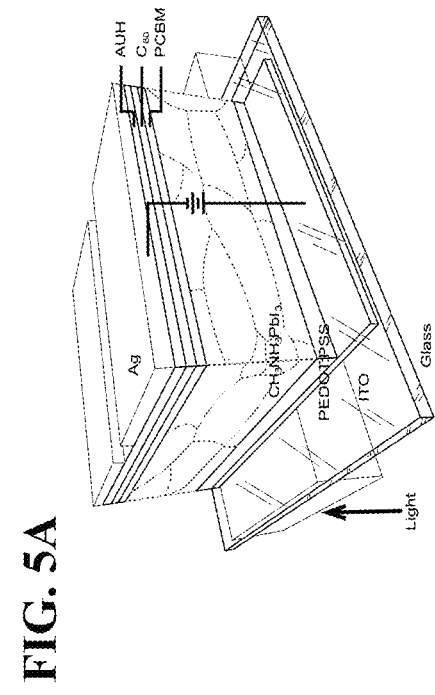
FIG. 5C depicts a photograph of the semitransparent perovskite solar cell with an AVT of ≈34% and an approximately 110 nm thin $CH_3NH_3PbI_3$ film.
Figure 5D:
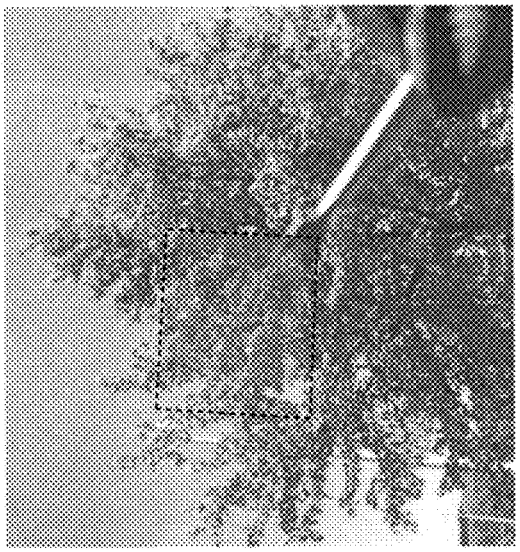
FIG. 5D depicts J-V characteristics of the 8.2% semitransparent solar cell having similar AVT. All cells are fabricated by surface passivation approach.

FIG. 5A depicts a semitransparent perovskite solar cell device structure. FIG. 5B depicts UV-Vis transmittance spectra through the complete semitransparent device for different perovskite layer thicknesses. FIG. 5C depicts a photograph of the semitransparent perovskite solar cell with an AVT of ≈34% and an approximately 110 nm thin $CH_3NH_3PbI_3$ film. FIG. 5D depicts J-V characteristics of the 8.2% semitransparent solar cell having similar AVT. All cells are fabricated by surface passivation approach. The semitransparent solar cells were prepared by evaporating a 10 nm thin layer of Ag on the VAST-based glass/ITO/PEDOT:PSS/Perovskite surface after sequentially depositing a 20 nm layer of [6,6]-phenyl $C_{71}$-butyric acid methylester ($PC_{71}BM$), a very thin layer of (≈5 nm) of $C_{60}$ and a ≈10 nm layer of 11-amino-1-undecanethiol hydrochloride (AUH) (FIG. 5A, fabrication details in the procedure section). The current-voltage (J-V) characteristics of the full semitransparent solar cell devices with different thicknesses of absorber layer are measured under light intensities of 100 mW/cm$^2$ and are summarized in FIG. 5B. Additionally, the AVTs (between 400 and 800 nm spectral region) of the corresponding devices are depicted in the same table. It is seen that with increasing thickness of the photoactive perovskite layer, the AVTs gradually decrease as a result of increased light absorption. Nevertheless, an impressive PCE of 8.2% with an AVT of 34% is achieved when the active layer reaches about 110 nm of thickness. The digital photograph of the corresponding device in FIG. 5C depicts the overall optical transparency and color neutrality. Importantly, its J-V curve in FIG. 5D does not show major hysteresis under forward and reverse scan conditions.

TABLE 1

Average device parameters$^a$ of VAST based semitransparent perovskite solar cells under 1 sun (AM 1.5) illumination

| Thickness$^b$ (nm) | AVT (%) | $V_{oc}$ (V) | $J_{sc}$ (mA/cm$^2$) | FF (%) | PCE (%) |
|---|---|---|---|---|---|
| 310 | 12 | 0.94 (0.95) | 18.3 (18.7) | 73 (75) | 12.6 (13.3) |
| 230 | 16 | 0.94 (0.95) | 16.4 (16.8) | 72 (74) | 11.1 (11.8) |
| 180 | 24 | 0.94 (0.95) | 14.4 (14.9) | 69 (72) | 9.3 (10.2) |

TABLE 1-continued

Average device parameters[a] of VAST based semitransparent perovskite solar cells under 1 sun (AM 1.5) illumination

| Thickness[b] (nm) | AVT (%) | $V_{oc}$ (V) | $J_{sc}$ (mA/cm$^2$) | FF (%) | PCE (%) |
|---|---|---|---|---|---|
| 150 | 29 | 0.94 (0.95) | 13.8 (14.2) | 67 (70) | 8.7 (9.4) |
| 110 | 34 | 0.94 (0.95) | 11.7 (12.1) | 67 (71) | 7.4 (8.2) |
| 65 | 47 | 0.87 (0.88) | 7.5 (8.2) | 59 (63) | 3.8 (4.5) |

[a]Values in the parenthesis are for the best cells.
[b]Thickness of the CH$_3$NH$_3$PbI$_3$ layer.

Figure 6A:
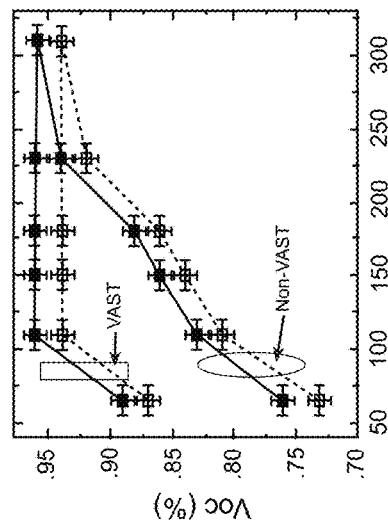
FIGS. 6A-6D depict comparisons of solar cell device parameters (FIG. 6A, PCE.
Figure 6B:
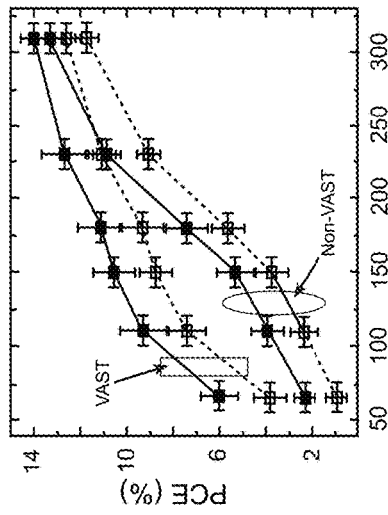
Figure 6C:
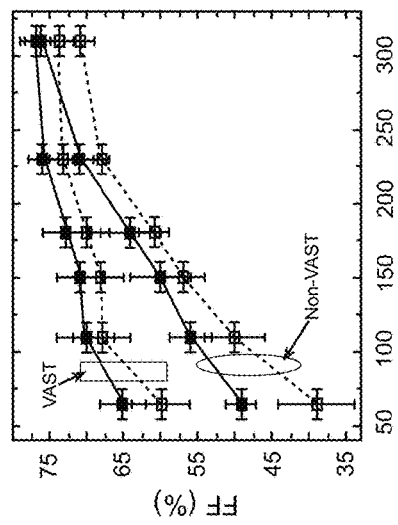
Figure 6D:
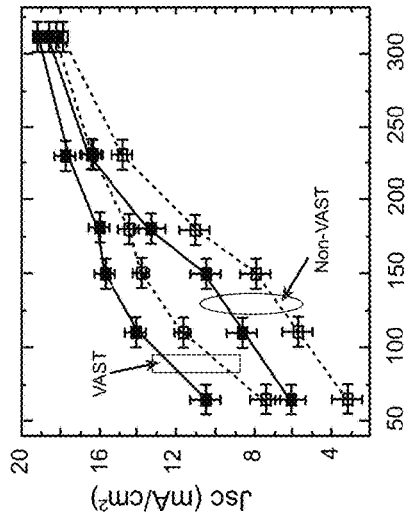

In order to compare the performances of the semitransparent devices with the standard opaque devices, non-transparent devices were made by covering the similarly prepared perovskite layer with 20 nm of PC$_{71}$BM, 30 nm of C$_{60}$, and 150 nm of Al consecutively. FIGS. 6A-6D and Tables 2a-2b show comparisons of semitransparent solar cell device parameters with those of the opaque devices, fabricated with and without the VAST process, comprising similar perovskite active layer thicknesses. FIGS. 6A-6D depict a comparison of solar cell device parameters (FIG. 6A, PCE; FIG. 6B, $V_{oc}$; FIG. 6C, $J_{sc}$; and FIG. 6D, FF) with varied perovskite layer thicknesses, prepared without (marked with a ring) and with (marked with a box) surface passivation strategy. Solid lines represent normal devices with top Al (150 nm) electrode, whereas dotted lines are for fully semitransparent devices with Ag (10 nm) top electrode. As a common trend, in all of these devices both with transparent top electrode and with opaque top electrode, a gradual decrease in the short-circuit current density ($J_{sc}$) with decreasing perovskite layer thickness is observed due to reduced photon absorption. This trend is also reflected in the overall PCEs of the completed devices. Notably, the decrease is rapid for the non-VAST based devices than that of the VAST based ones as a combined result of fast decrease in device field factor (FF), open-circuit voltage ($V_{oc}$), and $J_{sc}$. This is consistent with the fact that by using a fully solution-based process, the fabrication of perovskite films below 200 nm of thickness on very thin, unmodified PEDOT:PSS surfaces leads to discontinuous films with pinholes as seen in the SEM images (see FIGS. 2A-2F). The pinholes in the resultant films generate a high frequency of shunting pathways that allow direct contact between the top electrode and the PEDOT:PSS layer, causing an abrupt drop in device $V_{oc}$ and FF, and thereby PCE. Incident light on such poor covering perovskite films passes through without absorption decreasing the photocurrent density, $J_{sc}$. As our newly-developed VAST process enables the growth of pinhole-free, thin perovskite films, high PCEs together with high $V_{oc}$s and FFs can still be retained in devices made using the VAST technique with perovskite films down to 110 nm of thickness. Remarkably, the average PCE of these solar cell devices with a 110 nm thick perovskite active layer and opaque top Al electrode reached 9.3±1%, compared to 4.0±0.6% obtained for devices with similar layout but fabricated without the VAST process. Solar cell devices with the transparent top Ag electrode slightly lose their average PCEs due to non-optimized PCBM-electrode interface which could lead to some interfacial recombination losses. However, a series of semitransparent perovskite solar cells with reasonable high PCEs (best 8.2% with an AVT of 34%) and with various degree of visible light transmittances are obtained.

TABLE 2a

Comparison of average device parameters[a] of VAST based semitransparent perovskite solar cells with those of opaque devices under 1 sun (AM 1.5) illumination

| Thickness[b] (nm) | Device Type | $V_{oc}$ (V) | $J_{sc}$ (mA/cm$^2$) | FF (%) | PCE (%) |
|---|---|---|---|---|---|
| 310 | Semitransparent | 0.94 (0.95) | 18.3 (18.7) | 73 (75) | 12.6 (13.3) |
|  | Opaque | 0.96 (0.97) | 19.2 (19.5) | 76 (78) | 14.0 (14.8) |
| 230 | Semitransparent | 0.94 (0.95) | 16.4 (16.8) | 72 (74) | 11.1 (11.8) |
|  | Opaque | 0.96 (0.97) | 17.7 (18.3) | 75 (77) | 12.7 (13.7) |
| 180 | Semitransparent | 0.94 (0.95) | 14.4 (14.9) | 69 (72) | 9.3 (10.2) |
|  | Opaque | 0.96 (0.97) | 16.0 (16.6) | 72 (75) | 11.1 (12.1) |
| 150 | Semitransparent | 0.94 (0.95) | 13.8 (14.2) | 67 (70) | 8.7 (9.4) |
|  | Opaque | 0.96 (097) | 15.7 (163) | 70 (73) | 10.6 (11.5) |
| 110 | Semitransparent | 0.94 (0.95) | 11.7 (12.1) | 67 (71) | 7.4 (8.2) |
|  | Opaque | 0.96 (0.97) | 14.1 (14.6) | 69 (73) | 9.3 (10.3) |
| 65 | Semitransparent | 0.87 (0.88) | 7.5 (8.2) | 59 (63) | 3.8 (4.5) |
|  | Opaque | 0.89 (0.90) | 10.5 (11.3) | 64 (67) | 6.0 (6.8) |

TABLE 2b

Comparison of average device parameters[a] of non-VAST based semitransparent perovskite solar cells with those of opaque devices under 1 sun (AM 1.5) illumination

| Thickness[b] (nm) | Device Type | $V_{oc}$ (V) | $J_{sc}$ (mA/cm$^2$) | FF (%) | PCE (%) |
|---|---|---|---|---|---|
| 310 | Semitransparent | 0.94 (0.95) | 17.9 (18.2) | 70 (72) | 11.8 (12.4) |
|  | Opaque | 0.96 (0.97) | 18.6 (19.0) | 75 (76) | 13.4 (14.0) |
| 230 | Semitransparent | 0.92 (0.93) | 14.8 (15.2) | 67 (68) | 9.1 (9.6) |
|  | Opaque | 0.94 (0.95) | 16.5 (17.0) | 70 (72) | 10.9 (11.6) |
| 180 | Semitransparent | 0.86 (0.87) | 11.1 (12.0) | 60 (62) | 5.7 (6.5) |
|  | Opaque | 0.88 (0.89) | 13.4 (14.2) | 63 (67) | 7.4 (8.5) |
| 150 | Semitransparent | 0.84 (0.85) | 7.9 (8.7) | 56 (59) | 3.7 (4.4) |
|  | Opaque | 0.86 (0.87) | 10.5 (11.2) | 59 (63) | 5.3 (6.1) |
| 110 | Semitransparent | 0.81 (0.82) | 5.8 (6.7) | 49 (53) | 2.3 (2.9) |
|  | Opaque | 0.83 (0.84) | 8.6 (9.5) | 55 (58) | 4.0 (4.6) |
| 65 | Semitransparent | 0.73 (0.74) | 3.2 (4.0) | 38 (43) | 0.9 (1.3) |
|  | Opaque | 0.76 (0.77) | 6.2 (7.1) | 48 (50) | 2.3 (2.7) |

[a]Values in the parenthesis are for the best cells.
[b]Thickness of the CH$_3$NH$_3$PbI$_3$ layer.

EXAMPLES

Procedure

Device Fabrication: All thin-film perovskite solar cell devices were fabricated on patterned indium-doped tin oxide (ITO) glass (Sheet resistance of 15Ω/□) substrates the day of deposition, the ITO glass substrates were cleaned sequentially by sonicating with detergent, deionized water, acetone, and isopropanol, followed by drying with a high flow of nitrogen and UV-ozone treatment for 20 min. Filtered (0.45 micron PVDF filter) poly-(3,4-ethylenedioxythiophene:poly (styrenesulfonic acid) (PEDOT:PSS; Clevios P from Heraeus Materials Technology) was spin coated onto the clean ITO glass substrates at 3000 rpm for 60 s and then dried on a ceramic hot-plate at 160° C. for 15 min in ambient atmosphere. Thereafter, the PEDOT:PSS coated ITO glass substrates were immediately taken into a nitrogen filled glove box (O$_2$ level <5 ppm; H$_2$O level <0.1 ppm) where CH$_3$NH$_3$PbI$_3$ active layer was fabricated by a two-step sequential deposition method. First, hot PbI$_2$ (dissolved in anhydrous dimethylformamide at 75° C., 400 mg/ml concentration) solution was spun on the top of the PEDOT:PSS/ITO substrate at a spin rate of 6000 rpm for 35 s and the resulting PbI$_2$ layer was dried in a closed container for 15 min at room temperature followed by a mild annealing at 80°

C. for 10 min on a hot plate. Then $CH_3NH_3I$ solution (dissolved in anhydrous 2-propanol, 45 mg/ml concentration) was dripped on top of the dried $PbI_2$ layer during spinning at 6000 rpm for 35 s. Finally, the stacked precursor layers of $PbI_2$ and $CH_3NH_3I$ were annealed on a hot plate at 100° C. for 80 min. After the annealing step, a thin layer ($\approx$20 nm) of $PC_{71}BM$ (20 mg/ml in dichlorobenzene) was deposited on the top of the $CH_3NH_3PbI_3$ layer by spin-coating at 6000 rpm for 40 s. Ultimately, the opaque devices were finished by thermal evaporation of C60 (30 nm) and Al (150 nm) electrode. The semitransparent cells were prepared by evaporating a 10 nm thin layer of Ag on the glass/ITO/PEDOT:PSS/Perovskite surface after sequentially depositing a 20 nm layer of [6,6]-phenyl $C_{71}$-butyric acid methylester ($PC_{71}BM$), a very thin layer of ($\approx$5 nm) of $C_{60}$ and a $\approx$10 nm layer of 11-amino-1-undecanethiol hydrochloride (AUH). The AUH layer was deposited by spin-coating (5 mg/ml in isopropanol, 3000 rpm 60 s), followed by thermal annealing at 100° C. for 5 min. The active area of each device is 0.1 $cm^2$, measured by the overlap of top Al or Ag electrode and ITO. In order to avoid the overestimation of photocurrent density by the optical piping effect (any cross talking between two adjacent cells), device active area was defined by careful mechanical scribing by a sharp razor blade together with the use of an optical aperture.

Vapor Assisted Surface Treatment (VAST): The surface treatment of the PEDOT:PSS coated ITO glass substrates was carried out in a nitrogen filled glove box ($O_2$ level <5 ppm; $H_2O$ level <0.1 ppm) with thiourea vapor just before $CH_3NH_3PbI_3$ active layer deposition. In a typical preparation, PEDOT:PSS coated ITO glass substrates in a sealed glass container were placed on a hot plate with a set temperature of 60° C. In another hotplate, solid thiourea was heated up at 200° C. in a rubber-sealed glass vial connected to a needle-syringe. Vapor generated in the vial was collected in the needle-syringe and injected into the substrate holding glass container. Substrates were kept with the thiourea vapor at the pre-set temperature for desired time (up to 90 min) and subsequently used for $CH_3NH_3PbI_3$ active layer deposition. VAST may be performed by either physical or chemical vapor deposition (PVD or CVD), or solution-based depositions. Alternatively, the substrates can be placed facing different directions from the in-situ thiourea generated vapor in a single vessel or multi vessel chamber.

The present invention is a demonstration of a facile, vapor assisted surface passivation method that enables the fabrication of low-temperature, all-solution processed, pinhole-free, and very thin perovskite films on the PEDOT:PSS surface. Integration of these thin perovskite films having low morphological defects to a simple planar heterojunction (PHJ) device structure with transparent top electrode, leads to high performance semitransparent solar cells with PCEs of 9.4% and 8.2%, and AVT of 29% and 34%, respectively. These performances are on par with those of the best performing single junction semitransparent perovskite cells, but are based on fully solution processed perovskite films on thin PEDOT:PSS hole transport layer. Combining the high-quality, semitransparent perovskite films with state-of-the-art process optimized transparent top electrode, is expected to boost the performance of these devices further. These present results highlight the great potential of surface passivation strategy to grow defect-free, uniform perovskite films for different applications including but not limited to semitransparent photovoltaics. Our results could further impact the fabrication of lightweight perovskite based hybrid optoelectronic devices, such as field effect transistors, photodetectors, and light emitting diodes. The present approach is expected to provide an effective strategy to fabricate high quality perovskite films even by high-throughput solution-based deposition techniques like inkjet-printing, slot-die coating, or aerosol-jet printing etc. The applicability of this method is likely to be extended to other perovskite device architectures comprising different interlayers, and material systems. Considering that there are growing trends to integrate these material systems in different form factors (e.g. light weight, flexible and stretchable), the present unique surface passivation concept could also be applied to any arbitrary surfaces on a wide variety of flexible and stretchable substrate where the fabrication of high quality, defect-free, thin film perovskite is an issue.

One skilled in the art could readily realize the possible substitutions in materials, device architectures, fabrication tools, and processing steps that can be made without significantly detracting from the invention. For example, the present method of growing defect-free thin film by surface passivation method can be applied to any materials in the broad family of organic-inorganic hybrid perovskites having the formula $ABX_3$, or $A_2A'_{y-1}B_yX_{3y+1}$, wherein A and A' are organic monovalent cations that are independently selected from $R_1NH_3^+$, $R_1R_2NH_2^+$, $R_1R_2R_3NH^+$, $R_1R_2R_3R_4N^+$, $R_1NH_2^+$, $R_1R_2NH^+$, $R_1R_2R_3N^+$, $R_1R_2N^+$ (any one of $R_1$, $R_2$ and $R_3$ being independently selected from C1-C15 organic substituents comprising from 0 to 15 heteroatoms), or a mixture of any two or more thereof; B is selected from Pb, Sn, Ge, Si or a mixture of any two or more thereof; X is selected from Cl, Br, I, SCN or a mixture of any two or more thereof; and y=1, 2 to infinity. The surface passivating agent can be expanded beyond thiourea and can be selected from any chalcogenide (S, Se or Te) containing species with the general chemical formula $(E_3E_4)N(E_1E_2)N'C=X$ where any one of $E_1$, $E_2$, $E_3$ and $E_4$ can be independently selected from C1-C15 organic substituents comprising from 0 to 15 heteroatoms or H and X could be S, Se or Te, e.g. thioacetamide, selenoacetamide, selenourea, or $H_2S$, $H_2Se$, $H_2Te$ or LXH (L being $C_n$ organic substituents comprising heteroatoms, X=S, Se, Te). Alternative fabrication methods like one-step or multi-step layer-by-layer solution or vapor based deposition of precursors can be used for semiconducting layer instead of the one depicted in the current embodiment. In place of vapor treatment, the technique of surface treatment can be altered by solution, slurry, mist or gas.

In summary, we have successfully demonstrated a facile, vapor assisted surface passivation method that enables the fabrication of low-temperature, all-solution processed, pinhole-free, and very thin perovskite films on the PEDOT:PSS surface. Integration of these thin perovskite films having low morphological defects to a simple planar heterojunction (PHJ) device structure with transparent top electrode, leads to high performance semitransparent solar cells with PCEs of 9.4% and 8.2%, and AVT of 29% and 34%, respectively. These performances are on par with those of the best performing single junction semitransparent perovskite cells but are based on fully solution processed perovskite films on very thin PEDOT:PSS hole transport layer. Combining the high-quality, semitransparent perovskite films with state-of-the-art process optimized transparent top electrode is expected to boost the performance of these devices further. These results highlight the great potential of surface passivation strategy to grow defect-free, uniform perovskite films for different applications including but not limited to semi-transparent photovoltaics. Considering that there are growing trends to integrate these material systems in different form factors (e.g. light weight, flexible and stretchable), it will be of interest to apply the unique surface passivation concept to any arbitrary surfaces on a wide variety of flexible and stretchable substrate.

While the present invention has been illustrated by a description of one or more embodiments thereof and while these embodiments have been described in considerable detail, they are not intended to restrict or in any way limit the scope of the appended claims to such detail. Additional advantages and modifications will readily appear to those skilled in the art. The invention in its broader aspects is therefore not limited to the specific details, representative apparatus and method, and illustrative examples shown and described. Accordingly, departures may be made from such details without departing from the scope of the general inventive concept.

What is claimed is:

1. A method for making a layered perovskite structure, comprising:
   a) performing a vapor assisted surface treatment (VAST) of a substrate with a surface passivating agent;
   b) applying a layer of $PbI_2$ to the passivating agent;
   c) exposing the $PbI_2$ to methylammonium iodide ($CH_3NH_3I$) in an orthogonal solvent; and
   d) annealing the structure.

2. The method of making a layered perovskite structure of claim 1, wherein the substrate is a PEDOT:PSS coated ITO glass substrate.

3. The method of making a layered perovskite structure of claim 1, wherein the surface passivation agent is at least one a chalcogenide-containing species with the general chemical formula $(E_3E_4)N(E_1E_2)N'C=X$ where any one of $E_1$, $E_2$, $E_3$ and $E_4$ is independently selected from C1-C15 organic substituents comprising from 0 to 15 heteroatoms or hydrogen, and X is S, Se or Te, thiourea, thioacetamide, selenoacetamide, selenourea, $H_2S$, $H_2Se$, $H_2Te$ or LXH wherein L is a $C_n$ organic substituent comprising heteroatoms and X=S, Se, or Te.

4. The method of making a layered perovskite structure of claim 1, wherein the passivating agent is applied by a process selected from spin-coating, inkjet-printing, slot-die-coating, aerosol-jet printing, physical vapor deposition, chemical vapor deposition, and electrochemical deposition.

5. The method of making a layered perovskite structure of claim 1, wherein the orthogonal solvent is isopropanol.

6. The method of making a layered perovskite structure of claim 1, further comprising performing the annealing at 130° C. or lower.

7. The method of making a layered perovskite structure of claim 1, further comprising performing the annealing at 80° C. or lower.

8. The method of making a layered perovskite structure of claim 1, wherein the annealing is performed with a DMF vapor.

9. The method of making a layered perovskite structure of claim 1, wherein the steps of applying a layer of $PbI_2$ to the passivating agent, and exposing the $PbI_2$ to methylammonium iodide ($CH_3NH_3I$) in the orthogonal solvent are performed as a single step with the $PbI_2$ and methylammonium iodide ($CH_3NH_3I$) added in a single or mixed solvent system.

* * * * *